(12) United States Patent
Nagura

(10) Patent No.: US 7,474,814 B2
(45) Date of Patent: Jan. 6, 2009

(54) OPTICAL DEVICE, OPTICAL CONNECTOR, ELECTRONIC DEVICE, AND ELECTRONIC EQUIPMENT

(75) Inventor: Kazuhito Nagura, Kashihara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 170 days.

(21) Appl. No.: 11/242,074

(22) Filed: Oct. 4, 2005

(65) Prior Publication Data

US 2007/0196044 A1    Aug. 23, 2007

(30) Foreign Application Priority Data

Oct. 5, 2004  (JP)  ............................ P2004-292564
Oct. 5, 2004  (JP)  ............................ P2004-292568

(51) Int. Cl.
  *G02B 6/12*  (2006.01)
(52) U.S. Cl. ............................ 385/14; 385/88; 385/94; 398/135; 398/140
(58) Field of Classification Search .................... 385/14, 385/88–94, 147; 398/135–145, 156, 164
See application file for complete search history.

(56) References Cited

U.S. PATENT DOCUMENTS 4,974,591 A    12/1990  Awazu et al.

2003/0201526 A1    10/2003  Bolken et al.

FOREIGN PATENT DOCUMENTS

| JP | 4-184831 A | 7/1992 |
|----|---|---|
| JP | 6-283751 A | 10/1994 |
| JP | 9-102654 A | 4/1997 |
| JP | 2001-177118 A | 6/2001 |
| JP | 2002-270733 A | 9/2002 |

*Primary Examiner*—Kevin S Wood
(74) *Attorney, Agent, or Firm*—Birch, Stewart, Kolasch & Birch, LLP

(57) ABSTRACT

A light-emitting element (2) and a light-receiving element (3) are mounted, spaced from each other, on a main body (1a) of a flexible board (1). These elements (2, 3) are encapsulated in a light-permeable light-emitting side molded resin section (6a, 6b) and a light-permeable light-receiving side molded resin section (6c, 6d), respectively. Positions of the light-emitting element (2) and light-receiving element (3) and orientations of a light-emitting surface of the light-emitting element (2) and a light-receiving surface of the light-receiving element (3) are freely settable owing to flexibility of the flexible board (1). A communication IC (4) is mounted on the flexible board (1) and between the elements (2, 3) and encapsulated in an IC side molded resin section (6e, 6f). An extended portion (1b) extends from a midsection of the main body (1a) of the flexible board (1) and has an external connection terminal (11) at its tip.

13 Claims, 6 Drawing Sheets

OPTICAL DEVICE, OPTICAL CONNECTOR, ELECTRONIC DEVICE, AND ELECTRONIC EQUIPMENT

This nonprovisional application claims priority under 35 U.S.C. §119(a) on Patent Application Nos. 2004-292564 and 2004-292568 filed in Japan on Oct. 5, 2004, the entire contents of which are hereby incorporated by reference.

BACKGROUND OF THE INVENTION

The present invention relates to an optical device, and an optical connector, electronic device, and electronic equipment using it, and is particularly suitable for electronic equipment such as audio visual (AV) equipment and security equipment for a home network or on-vehicle network.

Conventionally, there has been an optical device in which a light emitting element and a light-receiving element are mounted on a board. In this optical device, positions of the light-emitting element and light-receiving element, and orientations of the light-emitting surface of the light-emitting element and the light-receiving surface of the light-receiving element are fixed. Optical connectors using such an optical device vary in shape depending on use or specification even if they have quite identical functions, so that many kinds of optical devices should be designed and produced in accordance with the specifications of the optical connectors, which causes high cost and low productivity.

The applicant proposes in this application that a flexible board is used as a means for solving such a problem, while there has conventionally been a mounting technology using a flexible board as described below.

A conventional first mounting technology using a flexible board is used for a concatenated sensor in which multiple sensors, ICs, etc. are mounted on a flexible board to detect a fixed width (see JP 4-184831 A, for example) This concatenated sensor is made in such a manner that its electronic components are mounted on a tape-like flexible board at predetermined intervals with a common power line, and are covered with a housing molded out of soft synthetic resin. In this concatenated sensor, the electronic components per se have functions of sensors or lighting devices, and are protected from dust, etc. without impairment of the functions by the housing molded out of soft synthetic resin.

Furthermore, a conventional second mounting technology using a flexible board is a high density mounting technology of covering a flexible board, on which a semiconductor memory is mounted, with silicon resin (see JP 2002-270733 A, for example).

However, the conventional first and second mounting technologies using a flexible board, in which the optical semiconductor elements (light-emitting element and light-receiving element) mounted on the flexible board are encapsulated, do not ensure that light from the optical semiconductor is effectively let out, and that light is effectively let in to the optical semiconductor.

Furthermore, there has been an electronic device in which a molded resin member is mounted on a flexible board (see JP 9-102654 A, for example).

In this electronic device, a photosensor encapsulated in resin in advance is electrically connected to a flexible board by soldering or other means, and then a molded resin member is formed by injection molding so as to cover the gap between the photosensor and the flexible board and part of the flexible board. Furthermore, the molded resin member for covering the wiring patterns provided on the flexible board is provided with a protection protrusion having a thickness gradually decreasing in the direction of projection of the wiring pattern. According to the molded resin member technology described above, portions of the flexible board on which no molded resin member is provided are bent easily because of flexibility thereof, while the wiring pattern portion of the flexible board is provided with the protection protrusion having a thickness gradually decreasing in the direction of projection of the wiring pattern, so that no bending stress is locally applied to the wiring pattern, thereby preventing the wiring pattern from breaking.

However, the molded resin member of the conventional electronic device described above is made, after the flexible board on which a photosensor is mounted is held by a mold for injection molding and pressurized, by injecting thermoplastic resin into the mold. The technology of making the molded resin member is not a technology to be applied to transfer molding. Furthermore, the clamping pressure of a mold at transfer molding is generally several-fold larger as compared with the clamping pressure of the mold at injection molding, so that the pressure applied to the flexible board and the wiring pattern when clamped by the mold at transfer molding should be reduced.

SUMMARY OF THE INVENTION

It is therefore an object of the present invention to provide an optical device having a high degree of general versatility which has a high degree of flexibility in arrangement of the light-emitting element and light-receiving element to be adaptable to various uses, and also provide an optical connector and electronic equipment using it.

It is another object of the present invention to provide an electronic device in which electronic components mounted on a flexible board can be encapsulated by transfer molding without cutting and damaging the wiring pattern on the flexible board, and also provide electronic equipment using it.

In order to accomplish the first object, an optical device according to the present invention comprises a flexible board; a light-emitting element and a light-receiving element which are mounted, spaced from each other, on the flexible board; a light-permeable light-emitting side molded resin section in which the light-emitting element is encapsulated; and a light-permeable light-receiving side molded resin section in which the light-receiving element is encapsulated. And, the light-emitting side molded resin section and the light-receiving side molded resin section are disposed apart such that the optical device is flexible between the light-emitting side molded resin section and the light-receiving side molded resin section.

In the optical device configured as described above, the light-emitting element and the light-receiving element are mounted on the flexible board at a predetermined interval, the light-permeable light-emitting side molded resin section in which the light-emitting element is encapsulated and the light-permeable light-receiving side molded resin section in which the light-receiving element is encapsulated are disposed apart, and the flexible board is flexible between the light-emitting side molded resin section and the light-receiving side molded resin section, so that positions of the light-emitting element and light-receiving element and orientations of the light-emitting surface of the light-emitting element and the light-receiving surface of the light-receiving element can be freely set with the help of the flexibility of the flexible board between the light-emitting side molded resin section and the light-receiving side molded resin section. Thus, the degree of freedom in arrangement of the light-emitting element and light-receiving element increases, and when this optical device is used for an optical connector for example, the interval between the light-emitting element and light-receiving element can be freely set, thereby realizing an optical device having a high degree of general versatility which is adaptable to various uses.

In one embodiment, the optical device further comprises a control integrated circuit mounted on the flexible board and between the light-emitting element and the light-receiving circuit, and an integrated circuit side molded resin section in which the control integrated circuit is encapsulated. And, the integrated circuit side molded resin section is disposed apart from the light-emitting side molded resin section and the light-receiving side molded resin section such that the optical device is flexible between the molded resin sections.

In this embodiment, the control integrated circuit is mounted on the flexible board and between the light-emitting element and the light-receiving element, and is encapsulated in the integrated circuit side molded resin section. The control integrated circuit side molded resin section is disposed apart from the light-emitting side molded resin section and the light-receiving side molded resin section, and the flexible board is flexible between the molded-resin sections, so that changing the positions of the light-emitting element and light-receiving element or the orientations of the light-emitting surface of the light-emitting element and the light-receiving surface of the light-receiving element with the help of the flexibility of the flexible board would have little effect on the control integrated circuit between the light-emitting element and the light-receiving element. Furthermore, since the control integrated circuit is mounted on the flexible board and between the light-emitting element and the light-receiving element, it becomes easy to route signal wires.

In one embodiment, the flexible board has a main body on which the light-emitting element and the light-receiving element are disposed at opposite sides, and an extended portion which extends from roughly a midsection of the main body and which has an external connection terminal at a tip thereof.

In this embodiment, the extended portion having the external connection terminal for passing a signal from/to the outside extends from roughly the midsection of the main body of the flexible board, and the light-emitting element and the light-receiving element are disposed on both sides of the main body with the control integrated circuit in between, so that changing the positions of the light-emitting element and light-receiving element and/or the orientations of the light-emitting surface of the light-emitting element and the light-receiving surface of the light-receiving element with the help of the flexibility of the flexible board would have little effect on the extended portion. Furthermore, when the external connection terminal of the extended portion of the flexible board is connected to the outside, even if the extended portion is bent in any direction, stresses applied to the light-emitting element and the light-receiving element on the main body are small, and therefore the reliability can be increased.

In one embodiment, the extended portion of the flexible board is bent in a direction roughly parallel to a line connecting the light-emitting element and the light-receiving element.

In this embodiment, the extended portion of the flexible board is bent in the direction roughly parallel to the line connecting the light-emitting element and the light-receiving element, so that the flexible board can be downsized as a whole, and thereby the manufacturing cost can be decreased.

In one embodiment, a notch is provided between the main body and the extended portion of the flexible board.

In this embodiment, the notch provided between the main body and the extended portion of the flexible board increases the degree of flexibility of bending the extended portion when the external connection terminal of the extended portion is connected to the outside.

In one embodiment, a light-permeable molding resin used for the light-emitting side molded resin section and the light-receiving molded resin section is a thermosetting resin.

In this embodiment, thermosetting resin is used as the light-permeable resin of the light-emitting side molded resin section and the light-receiving side molded resin section, so that the light-emitting side molded resin section and the light-receiving side molded resin section can be formed by transfer molding, and thereby the stresses applied to the elements, bonding wires, etc. can be reduced, thus increasing the reliability, and the resin is cured faster, thus increasing the productivity. Also, it is preferable that a thermosetting resin is also used for the integrated circuit side molded-resin section.

In one embodiment, a lens is integrally formed on each of the light-emitting side molded resin section and the light-receiving side molded resin section.

In this embodiment, an optical signal from the light-emitting element is effectively let out to the outside, and an optical signal received from the outside is effectively let in to the light-receiving element, by the lenses formed on the light-emitting side molded resin section and the light-receiving side molded resin section. Furthermore, since the lenses are integrally formed, separate processes of making the lenses are not required, thus reducing the cost.

In one embodiment, at least one of a capacitive element, a resistive element, and a crystal oscillator is mounted between the molded resin sections of the flexible board.

In this embodiment, necessary circuits can be formed on the flexible board by mounting the capacitive element, the resistive element, and/or the crystal oscillator in an exposed area or areas that is/are not covered with the resin, of the flexible board.

In one embodiment, the flexible board is mounted with a semiconductor chip in which a photodiode, which is the light-receiving element, and a circuit for processing a signal from the photodiode are integrated.

In this embodiment, a semiconductor chip in which a photodiode used as the light-receiving element and a circuit for processing a signal from the photodiode are integrated is mounted on the flexible board, so that the photodiode and the circuit for processing a signal from the photodiode are not required to be mounted separately and to have a signal connection separately, thus increasing the productivity and the reliability.

An optical connector according to the present invention uses any one of the optical devices described above.

According to the configuration as described above, an optical device having a high degree of flexibility in arrangement of the light-emitting element and the light-receiving element can be applied to optical connectors of various specifications, and significant cost reduction can be realized by using one kind of optical devices for many kinds of optical connectors.

In one embodiment, the optical connector further comprises a housing in which at least a main body of the flexible board of the optical device is accommodated. And, the main body of the flexible board is disposed in the housing while being kept planar.

In this embodiment, the main body of the flexible board of the optical device is disposed in the housing while being kept planar in order that one side on which the light-emitting element is mounted and the other side on which the light-receiving element is mounted are in the same plane without the main body bent, so that the interval between the light-emitting element and the light-receiving element is uniquely defined, and thus positioning of it at fabrication is easy.

In one embodiment, the optical connector comprises a housing in which at least a main body of the flexible board of the optical device is accommodated, and the main body of the flexible board is disposed in the housing in such a manner that one side of the housing on which the light-emitting element is mounted and the other side of the housing on which the light-receiving element is mounted are turned back toward a center of the main body, and that a light-emitting surface of the light-emitting element and a light-receiving surface of the light-receiving element face outwardly in one direction. Turning back the flexible board means bending the flexible board with a curvature at which a stress is not applied to the flexible board.

In this embodiment, the main body of the flexible board of the optical device is disposed in the housing in such a manner that one side on which the light-emitting element is mounted and the other side on which the light-receiving element is mounted are bent to the center side of the main body, and that the light-emitting surface of the light-emitting element and the light-receiving surface of the light-receiving element face the outside in the same direction, so that the interval between the light-emitting element and the light-receiving element can be freely set according to the degree of the turn-back or bending of the main body of the flexible board.

In one embodiment, the extended portion of the flexible board of the optical device is, preferably, bent so as to be generally square to the main body.

In this embodiment, the extended portion of the flexible board bent to be generally square to the main body facilitates mounting of the optical connector in an apparatus.

Electronic equipment according to the present invention comprises any one of the optical connectors as described above.

In the electronic equipment configured as described above, an optical connector provided with an optical device having a high degree of general versatility is used which is adaptable to various uses, so that significant cost reduction can be realized.

The present invention also provides an electronic device comprising a flexible board having a flexible base, a first wiring pattern provided on one surface side of the base, and a second wiring pattern provided on another surface side opposite to the one surface side of the base; an electronic component which is mounted on one surface of the flexible board and is electrically connected with the first wiring pattern; a first molded resin section which is provided on one surface of the flexible board to encapsulate the electronic component therein; and a second molded resin section which is provided on another surface opposite to the one surface of the flexible board to seal at least an area opposite to the electronic component. And, an outer circumference of the first molded resin section and an area near the outer circumference have no first wiring pattern on the one surface of the flexible board, and have no first wiring pattern between the one surface of the flexible board and the base; and an outer circumference of the second molded resin section and an area near the outer circumference have no second wiring pattern on the other surface of the flexible board, and have no second wiring pattern between the other surface of the flexible board and the base. In this specification, the "electronic component" means a component, which needs to be electrically connected to a wiring pattern, such as a light-emitting element, light-receiving element, or communication IC, but is not limited to these and may be a passive component such as a capacitive element or a resistive element, an active component such as a transistor, an integrated circuit, or the like.

In the electronic device configured as described above, the outer circumference of the first molded resin section and the area near the outer circumference have no first wiring pattern on the surface of the flexible board, and have no first wiring pattern between the surface of the flexible board and the base, while the outer circumference of the second molded resin section and the area near the outer circumference have no second wiring pattern on the surface of the flexible board, and have no second wiring pattern between the surface of the flexible board and the base, so that such a clamping pressure of the mold as to cut or damage wiring patterns is not applied to the first and second wiring patterns during the transfer molding process. More specifically, at transfer molding, a planar portion, which is contact with the flexible board, of the mold outside of its cavity applies a clamping pressure to an area of the flexible board surrounding the periphery of an area in which a molded-resin section is to be formed, and an edge of the cavity of the mold comes into contact with the flexible board in line. The first and second wiring patterns are, however, disposed so as not to be between the mold and the base at or near a boundary between the planar portion and the cavity (corresponding to the outer circumference of the first or second molded-resin section) where the difference between the clamping pressure applied to the flexible board and the cavity side pressure is large. Thus, such a pressure as to cut or damage a wiring pattern is not applied to the first and second wiring patterns. Consequently, the electronic components mounted on the flexible board can be encapsulated by transfer molding without cutting or damaging of the wiring patterns.

In one embodiment, part of the first wiring pattern, which part is encapsulated in the first molded resin section, is connected via a through-hole with part of the second wiring pattern, which part is not encapsulated in the second molded resin section.

In this embodiment, connecting the part encapsulated in the first molded resin section of the first wiring pattern, via the through-hole, to the part not encapsulated in the second molded resin section of the second wiring pattern makes it possible to draw out the first wiring pattern connected with the electronic component via the through-hole and the second wiring pattern.

In one embodiment, the first and second molded resin sections are each provided with a radius at their respective peripheries.

In this embodiment, due to the radius provided at the peripheries of the first and second molded resin sections, the clamping pressure applied to the flexible board linearly is distributed over the surface at transfer molding. Therefore, when the flexible board is clamped with such a high pressure as not to cause a resin leak to an area of the flexible board other than the first and second molded resin sections, the stress applied to the flexible board can be reduced.

In one embodiment, reinforcements are provided between each of peripheries of the first and second molded resin sections and the flexible board.

In this embodiment, due to the reinforcements provided between the peripheries of the first and second molded resin sections and the base, the clamping pressure linearly applied to the flexible board is distributed over the surface at transfer molding. Therefore, when the flexible board is clamped with such a high pressure as not to cause a resin leak to an area of the flexible board other than the first and second molded resin sections, the stress applied to the flexible board is relaxed.

In one embodiment, the electronic component encapsulated in the first molded resin section is an optical semiconductor element or an integrated circuit including an optical semiconductor element, and the first molded resin section is made of a light-permeable resin and integrally formed with a lens.

In this embodiment, by the lenses formed on the first molded resin section made of light-permeable resin, an optical signal from the light-emitting element can be effectively let out to the outside, and an optical signal received from the outside can be effectively let in to the light-receiving element. Furthermore, since the lenses are integrally formed, separate processes of making the lenses are not required, thus reducing the cost.

In one embodiment, a resin used for the first and second molded resin sections is a thermosetting resin.

In this embodiment, a thermosetting resin is used as the resin of the first and second molded resin sections, so that the first and second molded resin sections can be formed by transfer molding, which reduces stresses applied to the electronic components, the bonding wires, etc, thus increasing the reliability. Also, the resin is cured faster, thus increasing the productivity.

In one embodiment, the first and second molded resin sections are connected with each other via a resin filled in a through-hole provided in the flexible board.

In this embodiment, because the first and second molded resin sections are connected and integrated with each other via the resin filled in the through-holes provided in the flexible board as if they hold the flexible board from its both sides, the first and second molded resin sections are prevented from coming off the flexible board. Thus, the reliability is increased.

Electronic equipment according to the present invention uses any one of the electronic devices described above.

Due to the use of the electronic device in which the electronic components mounted on the flexible board are encapsulated by transfer molding without cutting or damaging of the wiring patterns, electronic equipment having a simple configuration and high reliability can be obtained.

As is apparent from the above, according to the present invention, an optical device having a high degree of general versatility can be realized which has a high degree of flexibility in arrangement of the light-emitting element and the light-receiving element to set the interval between the light-emitting element and the light-receiving element without restraint and to be adaptable to various uses.

According to the present invention, an optical device having a high degree of flexibility in arrangement of the light-emitting element and the light-receiving element can be applied to optical connectors of various specifications, so that significant cost reduction can be realized by using one kind of optical devices for many kinds of optical connectors.

In electronic equipment according to the present invention, an optical connector having a high degree of general versatility is used which is adaptable to various uses, so that significant cost reduction can be realized.

Furthermore, according to the present invention, an electronic device can be realized in which the electronic components mounted on the flexible board can be encapsulated by transfer molding without cutting and damaging the wiring pattern.

Furthermore, according to the present invention, electronic equipment having a simple configuration and high reliability can be realized by using the electronic device.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein.

DETAILED DESCRIPTION OF THE INVENTION

An optical device, optical connector, electronic device, and electronic equipment according to the present invention will be described in detail on the basis of the embodiments shown in the figures.

First Embodiment

Figure 1:
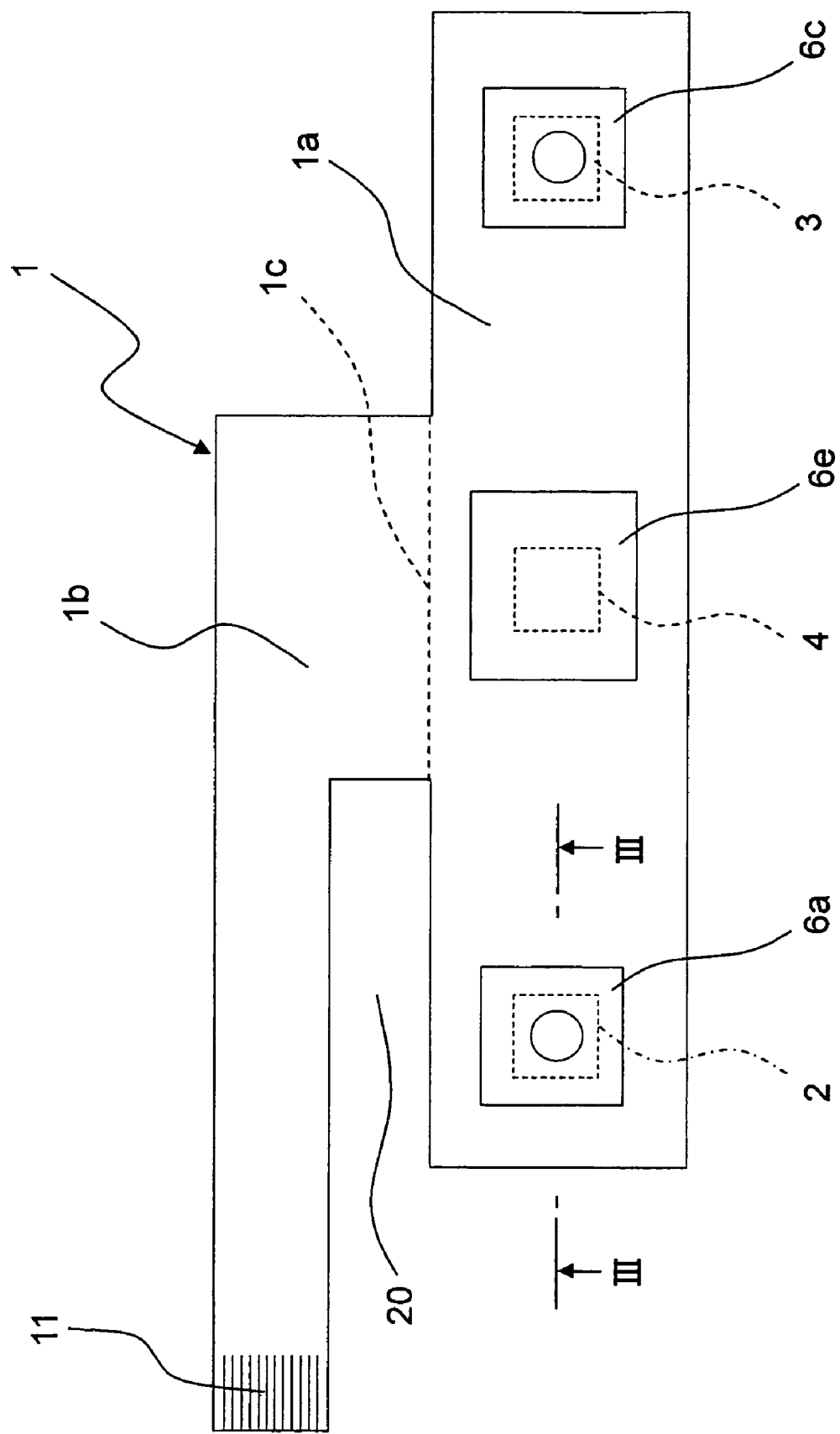
FIG. 1 is a top view of an optical device which is an example of the electronic device of the first embodiment of the present invention.
Figure 2:
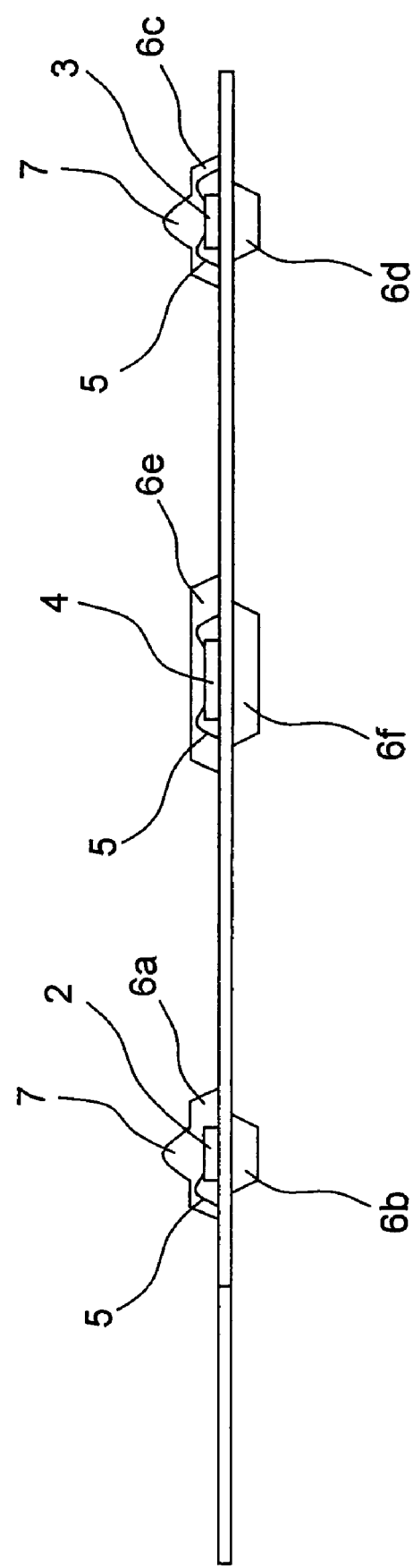
FIG. 2 is a side view of the optical device.

FIG. 1 is a plan view of an optical device which is an example of the electronic device of the first embodiment of the present invention, and FIG. 2 is a side view of the optical device seen from the bottom of FIG. 1. As shown in FIG. 1, a flexible board 1 has a rectangular main body 1*a* and an extended portion 1*b* which extends sideward from a midsection of the main body 1*a* and then is bent in the longitudinal direction of the main body 1*a*. An external connection terminal 11 is provided at a tip of the extended portion 1*b* of the flexible board 1. The flexible board 1 also has a base 22 (shown in FIG. 3). A first wiring pattern (including electrodes 8A and 9A shown in FIG. 3) is provided on one surface side of the base 22, and a second wiring pattern (including electrodes 8B and 9B shown in FIG. 3) is provided on the other surface side of the base 22. Part of at least one of the first and second wiring patterns of the flexible board 1 is connected with the external connection terminal 11 at the end of the extended portion 1*b*. For example, the first wiring pattern of the flexible board 1 is used for an electrical connection, on the one surface side of the flexible board 1, among a light emitting element 2, a light-receiving element 3, and a communication IC 4, and the second wiring pattern is used for electrical connections, on the other surface side of the flexible board 1, between the light-emitting element 2 and the communication IC 4, between the light-receiving element 3 and the communication element 4 and between the communication IC 4 and the external connection terminal 11 on the end of the extended portion 1*b*. The second wiring pattern may be used for electrical connections between the light-emitting element and the external connection terminal, and between the light-receiving element and the external connection terminal. When the wiring is complicated, the first wiring pattern may be used for a connection between the communication IC 4 and the external connection terminal 11 at the end of the extended portion 1*b*.

Furthermore, the light-emitting element 2 and the light-receiving element 3, which are each an example of the optical semiconductor element, are mounted near both short sides (both ends in the longitudinal direction) of the main body 1a of the flexible board 1, respectively. The communication IC 4, which is an example of the control integrated circuit, is mounted on the main body 1a of the flexible board 1 and between the light-emitting element 2 and the light-receiving element 3. A notch 20 is provided between the main body 1a of the flexible board 1 and the bent portion of the extended portion 1b. Furthermore, a photodiode is used as the light-receiving element 3.

As shown in FIG. 2, the light-emitting element 2 mounted on the main body 1a of the flexible board 1 is encapsulated in a first encapsulation member 6a that is an example of the first molded resin section made of light-permeable resin, and a second encapsulation member 6b that is an example of the second molded resin section is formed on the side of the flexible board 1 opposed to the first encapsulation member 6a. The first and second encapsulation members 6a and 6b are integrally formed by transfer molding, and constitute the light-emitting side molded resin section.

Furthermore, the light-receiving element 3 mounted on the main body 1a of the flexible board 1 is encapsulated in a first encapsulation member 6c that is an example of the first molded resin section made of a light-permeable resin, and a second encapsulation member 6d that is an example of the second molded resin section is formed on the side of the flexible board 1 opposed to the first encapsulation member 6c. The first and second encapsulation members 6c and 6d are integrally formed by transfer molding, and constitute the light-receiving side molded resin section.

Furthermore, the communication IC 4 mounted on the main body 1a of the flexible board 1 is encapsulated in a first encapsulation member 6e that is an example of the first molded resin section made of a light-permeable resin, and a second encapsulation member 6f that is an example of the second molded resin section is formed on the side of the flexible board 1 opposed to the first encapsulation member 6e. The first and second encapsulation members 6e and 6f are integrally formed by transfer molding, and constitute the integrated circuit side molded resin section.

As the light-permeable resin, light-permeable epoxy resin containing transparent filler (e.g., silica glass) is used, and a desired coefficient of linear expansion is obtained by adjusting the amount of the transparent filler. As an example of the light-permeable epoxy resin, there are phenolic cured epoxy resin, acid anhydride cured epoxy resin, and the like.

Furthermore, as shown in FIG. 2, the light-emitting element 2, the light-receiving element 3, and the communication IC 4 are encapsulated in the independent first encapsulation members 6a, 6c, and 6e, respectively, by transfer molding. A lens 7 for effectively letting out an optical signal to the outside is integrally formed with the first encapsulation member 6a for the light-emitting element 2, and a lens 7 for effectively let in an optical signal received from the outside is integrally formed with the first encapsulation member 6c for the light-receiving element 3.

Figure 3:
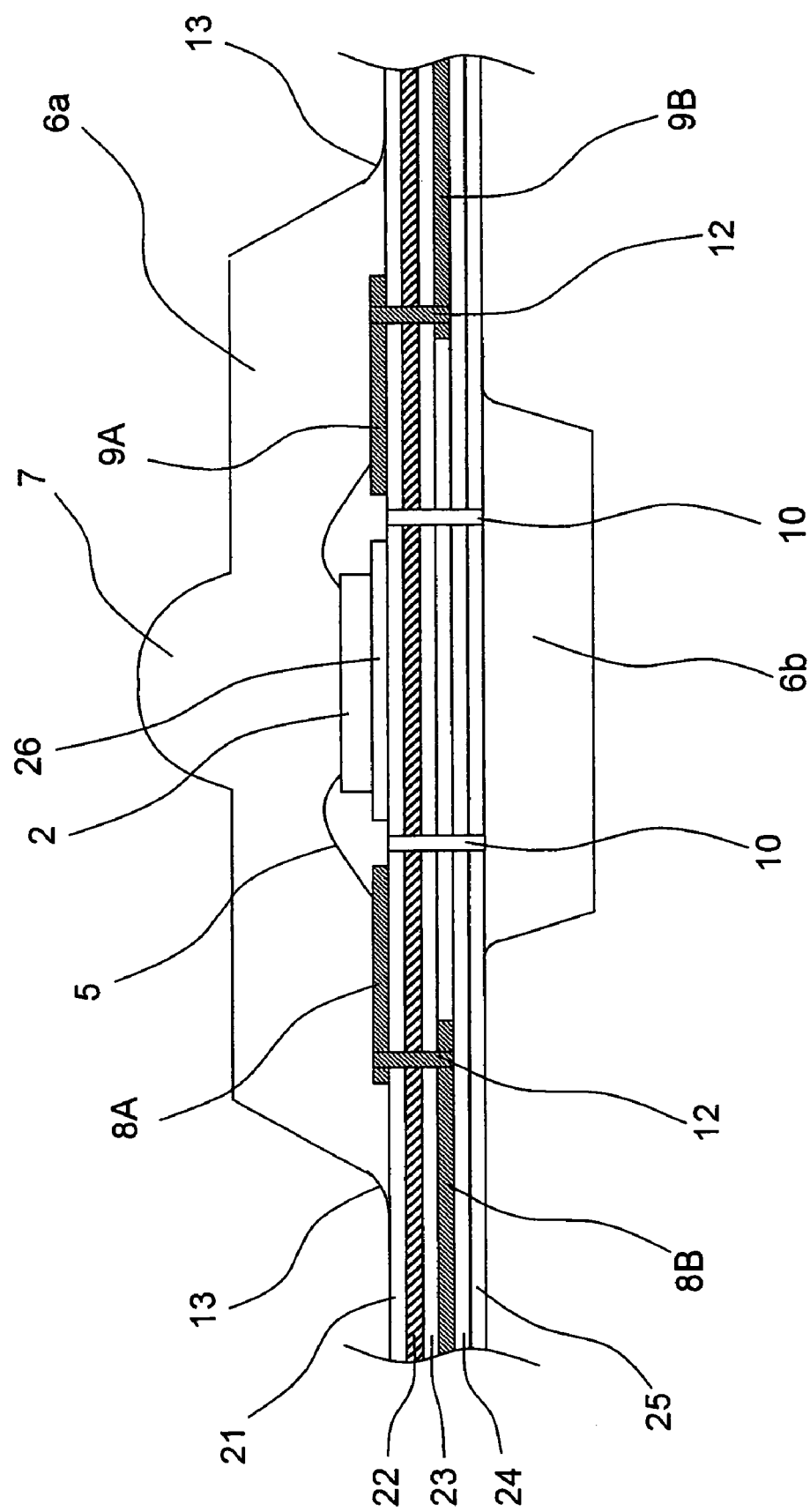
FIG. 3 is a cross-sectional view taken along the line III-III of FIG. 1.

FIG. 3 is a cross-sectional view taken along the line III-III of FIG. 1. The light-receiving element 3 side cross section is similar to the cross section shown in FIG. 3. Also, the communication IC 4 side cross section is similar to the cross section shown in FIG. 3 except for the lens.

As shown in FIG. 3, on the flexible board 1, electrodes 8A and 9A that exemplify the first wiring pattern are formed on a mounting surface of the base 22 via an adhesive layer 21. Furthermore, electrodes 8B and 9B that exemplify the second wiring pattern are formed on the back surface of the base 22 via an adhesive layer 23. In addition, a protection layer 25 is formed on the electrodes 8B and 9B via an adhesive layer 24.

The electrodes 8A and 8B are electrically connected with each other via a through-hole 12, and the electrodes 9A and 9B are electrically connected with each other via a through-hole 12.

The light-emitting element 2 is mounted, by die bonding, on the mounting surface of the flexible board 1 via adhesive layers 21 and 26. The flexible board 1 has through-holes 10 provided near opposite sides of the light-emitting element 2. Two through-holes 10 are shown in FIG. 3, but more than two through-holes 10 may be provided. Furthermore, the electrodes 8A and 9A on the flexible board 1 are electrically connected with the electrode of the light-emitting element 2 through bonding wires 5.

The first and second encapsulation members 6a and 6b (as well as the first and second encapsulation members 6c and 6d, and the first and second encapsulation members 6e and 6f) are coupled to each other via the through-holes 10 at transfer molding. The first encapsulation member 6a (as well as 6c, 6e) of the flexible board 1 is used for sealing the through-holes 12 for electrical connection of the light-emitting element 2, light-receiving element 3, or communication IC 4, the bonding wires 5, and the back surface wiring portions 8B and 9B. On the other hand, the second encapsulation member 6b (6d, 6f) on the back surface is formed only in an inner area where the through-holes 12 are not sealed with it.

In the first embodiment, the first and second encapsulation members 6a and 6b constituting the light-emitting side molded resin section, the first and second encapsulation members 6c and 6d constituting the light-receiving side molded resin section, and the first and second encapsulation members 6e and 6f constituting the integrated circuit side molded resin section are formed at the same time by transfer molding. However, the light-emitting side molded resin section and the light-receiving side molded resin section may be formed from light-permeable resin at the same time by transfer molding, and the integrated circuit side molded resin section may be formed from non-light-permeable resin by another transfer molding.

Because of such a structure of the flexible board 1, wirings between the electrodes of the light-emitting element 2 and light-receiving element 3 and the electrode of the communication IC 4, and wirings between each of the electrodes and the external connection terminal 11 are possible without disposing the wiring portions 8A, 9A, 8B, and 9B and the through-holes 12 in the area to which the mold for transfer molding directly makes contact when the board 1 is clamped by the mold.

Furthermore, the light-permeable resin used for the first encapsulation members 6a, 6c, and 6e and second encapsulation members 6b, 6d, and 6f has the same coefficient of linear expansion as that of the light-emitting element 2, light-receiving element 3, communication IC 4, bonding wires 5, electrodes 8A and 9A, and flexible board 1 to be encapsulated. Because of this, the degree of shrinkage after the encapsulation process is suppressed and the reliability in an operating temperature environment can be increased.

In this optical device, the light-emitting element 2 and the light-receiving element 3 are mounted on the flexible board 1 at a predetermined interval, and are encapsulated in the light-permeable light-emitting side molded resin section 6a, 6b and light-receiving side molded resin section 6c, 6d, so that positions of the light-emitting element 2 and light-receiving element 3 and orientations of a light-emitting surface of the light-emitting element 2 and a light-receiving surface of the light-receiving element 3 can be freely set with the help of the flexibility of the flexible board 1 between the light-emitting side molded resin section 6a, 6b in which the light-emitting element 2 is encapsulated and the light-receiving side molded resin section 6c, 6d in which the light-receiving element 3 is encapsulated. Thus, the degree of flexibility in arrangement of the light-emitting element 2 and light-receiving element 3 increases, and when this optical device is used for an optical connector, the light-emitting element 2 and light-receiving element 3 can be freely arranged, thereby realizing an optical device having a high degree of general versatility which is adaptable to various uses.

Furthermore, the communication IC 4 is mounted on the flexible board 1 and between the light-emitting element 2 and the light-receiving element 3, and is encapsulated in the integrated circuit side molded resin section 6e, 6f, so that changing the positions of the light-emitting element 2 and light-receiving element 3 or the orientations of the light-emitting surface of the light-emitting element 2 and the light-receiving surface of the light-receiving element 3 with the help of the flexibility of the flexible board 1 has little effect on the communication IC 4, and therefore the stress can be reduced and the reliability can be increased.

Furthermore, the light-emitting element 2 and the light-receiving element 3 are disposed on both sides of the main body 1a of the flexible board 1, and the extended portion 1b having the external connection terminal 11 for passing a signal from/to the outside extends from substantially the midsection of the main body 1a, so that changing the positions of the light-emitting element 2 and light-receiving element 3 or the orientations of the light-emitting surface of the light-emitting element 2 and the light-receiving surface of the light-receiving element 3 with the help of the flexibility of the flexible board 1 has little effect on the extended portion 1b. Furthermore, when the external connection terminal 11 of the extended portion 1b of the flexible board 1 is connected to the outside, even if the extended portion 1b is bent or turned in any direction, stresses applied to the light-emitting element 2 and the light-receiving element 3 on the main body 1a are small, and therefore the reliability can be increased.

Furthermore, the extended portion 1b of the flexible board 1 is bent in the direction substantially parallel to a line connecting the light-emitting element 2 and the light-receiving element 3, so that the flexible board 1 can be downsized as a whole, and thereby the manufacturing cost can be decreased.

Furthermore, the notch provided between the main body 1a and the extended portion 1b of the flexible board 1 increases the degree of flexibility of bending the extended portion 1b when the external connection terminal 11 at the tip of the extended portion 1b is connected to the outside, and thereby the optical device can be easily installed in the housing. The position and shape of the notch are not limited to these, and may be any ones which increase the degree of freedom of bending the extended portion.

Furthermore, since the light-permeable resin used for the light-emitting side molded resin section 6a, 6b and the light-receiving side molded resin section 6c, 6d is a thermosetting resin, the light-emitting side molded resin section 6a, 6b and the light-receiving side molded resin section 6c, 6d can be formed by transfer molding, and thereby the stresses applied to the elements, bonding wires, etc. can be reduced, thus increasing the reliability, and the resin is cured faster, thus increasing the productivity.

Furthermore, an optical signal from the light-emitting element 2 can be effectively let out to the outside by the lens 7 formed on the first encapsulation member 6a of the light-emitting side molded resin section, while an optical signal received from the outside can be effectively let in to the light-receiving element 3 by the lens 7 formed on the first encapsulation member 6c of the light-receiving side molded resin section. Since the lenses 7 are integrally formed, separate processes of making the lenses are not required, thus reducing the cost.

In this connection, a semiconductor chip in which a photodiode used as the light-receiving element 3 and a circuit for processing a signal from the photodiode are integrated may be mounted on the flexible board 1. In this case, the photodiode and the circuit for processing a signal from the photodiode are not required to be mounted separately and to have a signal connection separately, thus increasing the productivity and the reliability.

In the optical device, the outer circumference of the first encapsulation member 6a, 6c, 6e that is the first molded-section and the area near the outer circumference have no wiring pattern on the top surface of the flexible board 1, and have no wiring pattern between the top surface of the flexible board 1 and the base 22, while the outer circumference of the second encapsulation member 6b, 6d, 6f that is the second molded-section and the area near the outer circumference have no wiring pattern on the back surface of the flexible board 1, and have no wiring pattern between the back surface of the flexible board 1 and the base 22. In other words, the size of the first encapsulation member 6a, 6c, 6e is larger than that of the second encapsulation member 6b, 6d, 6f, and the difference between the two sizes provides an area on the flexible board 1 in which encapsulation is provided by the first encapsulation member 6a, 6c, 6e but not by the second encapsulation member 6b, 6d, 6f, and in which wiring patterns (electrodes 8A and 8B, electrodes 9A and 9B) are drawn out from the first encapsulation member 6a, 6c, 6e side to the second encapsulation member 6b, 6d, 6f side via the through-holes 12. Because of this, the clamping pressure of the mold is prevented from being applied to the wiring patterns at the transfer molding process. Consequently, the electronic components (light-emitting element 2, light-receiving element 3, and communication IC 4) mounted on the flexible board 1 can be encapsulated by transfer molding without cutting or damaging the wiring patterns.

Furthermore, the electrode 8A, 9A encapsulated in the first molded resin section (first encapsulation member 6a, 6c, 6e) of the first wiring pattern provided on one side (on which the light-emitting element 2, the light-receiving element 3 and the communication IC 4 are mounted) of the flexible board 1 is connected, via the through-hole 12, to the electrode 8B, 9B not encapsulated in the second molded resin section (second encapsulation member 6b, 6d, 6f) of the second wiring pattern provided on the other side (on which the light-emitting element 2, the light-receiving element 3 and the communication IC 4 are not mounted) of the flexible board 1, so that the electrode 8A, 9A connected with the electronic component is drawn out from the first molded resin section via the through-hole 12 and the electrode 8B, 9B.

Furthermore, the peripheries of the first and second molded resin sections (6a to 6f) are each provided with a radius (namely, a curve) 13, so that the clamping pressure linearly applied to the flexible board 1 is distributed over the surface at transfer molding, and therefore even if the flexible board 1 is clamped with such a high pressure as not to cause a resin leak to areas of the flexible board 1 other than the first and second molded resin sections, the stress in the flexible board 1 can be alleviated.

Furthermore, by the lenses 7 formed on the first molded resin section 6a-6f made of light-permeable resin, an optical signal from the light-emitting element can be effectively let out to the outside, and an optical signal received from the outside can be effectively let in to the light-receiving element 3. Since the lenses 7 are integrally formed, separate processes of making the lenses are not required, thus reducing the cost.

Furthermore, thermosetting resin is used as resin for the first and second molded resin sections 6a-6f, so that the first and second molded resin sections can be formed by transfer molding, and thereby the stresses applied to the electronic components, the bonding wires, etc. can be reduced, thus increasing the reliability, and the resin is cured faster, thus increasing the productivity.

Furthermore, the first and second molded resin sections 6a-6f are connected with each other via the resin in the through-holes 10 provided in the flexible board 1 so that the first and second molded resin sections (first and second encapsulation members 6a and 6b, first and second encapsulation members 6c and 6d, first and second encapsulation members 6e and 6f) are integrated as if they hold the flexible board 1 from its both sides. As a result, the first and second molded resin sections are prevented from coming off, which increases the reliability.

Furthermore, by using an electronic device in which the electronic components mounted on the flexible board 1 are encapsulated by transfer molding without cutting or damaging the wiring patterns, electronic equipment having a simple configuration and high reliability can be obtained. In particular, the optical device described above is suitable for electronic equipment such as AV equipment and security equipment for a home network or an on-vehicle network. In this specification, the "electronic component" means a component, which needs to be electrically connected to a wiring pattern, such as a light-emitting element, light-receiving element, or communication IC, but is not limited to these and may be a passive component such as a capacitive element or a resistive element, an active component such as a transistor, an integrated circuit, or the like.

Second Embodiment

Figure 4:
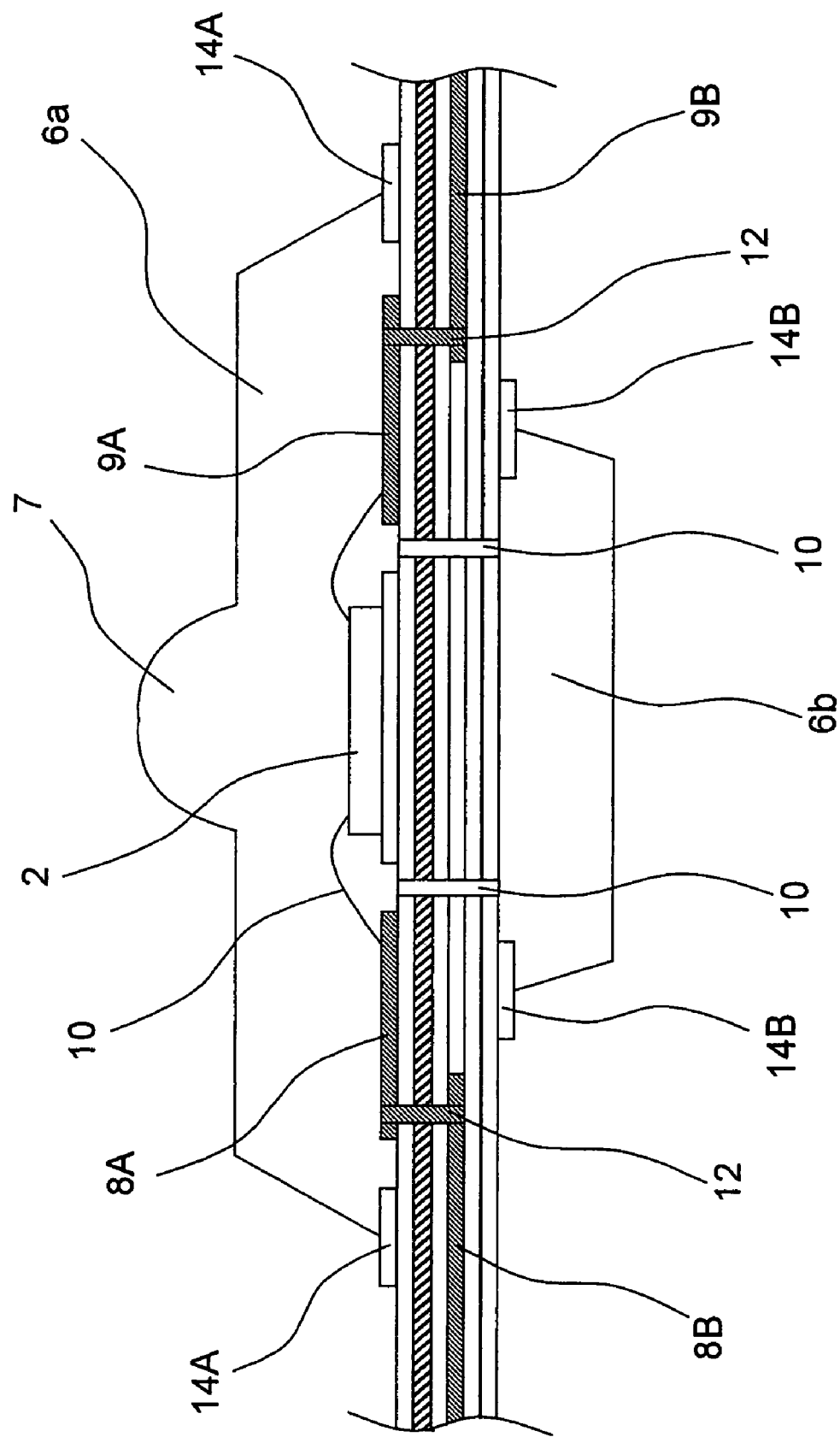
FIG. 4 is a cross-sectional view of an optical device, according to a second embodiment of the present invention, which is an example of the electronic device.

FIG. 4 is a cross-sectional view of an optical device which is an example of the electronic device of the second embodiment of the present invention. The optical device of the second embodiment has the same configuration as that of the optical device of the first embodiment except for its reinforcements. Thus, the same reference numbers are attached to the same components, explanation about which is omitted here, and FIGS. 1 and 2 will also be used for the description of this embodiment.

As shown in FIG. 4, reinforcements 14A and 14B made of hard resin (e.g., polyimide film) are disposed between the flexible board and the peripheries of the first and second encapsulation members 6a and 6b that are the first and second molded resin sections. The reinforcements 14A and 14B may be made of any other hard material such as dummy metal.

The optical device of the second embodiment produces the effect that a clamping pressure applied to the flexible board 1 linearly is distributed over the surface at transfer molding, and therefore even if the flexible board 1 is clamped with a large force so as not to cause a resin leak to areas of the flexible board 1 other than the first and second molded resin sections (first and second encapsulation members 6a and 6b), the stress applied to the flexible board 1 can be reduced by the reinforcements 14A and 14B. Also, the first and second encapsulation members 6c and 6d and the first and second encapsulation members 6e and 6f, shown in FIGS. 1 and 2, are similarly provided with reinforcements 14A and 14B between their peripheries and the flexible board 1.

The optical device of the second embodiment has the same effect as that of the optical device of the first embodiment in the other respects.

Third Embodiment

Figure 5:
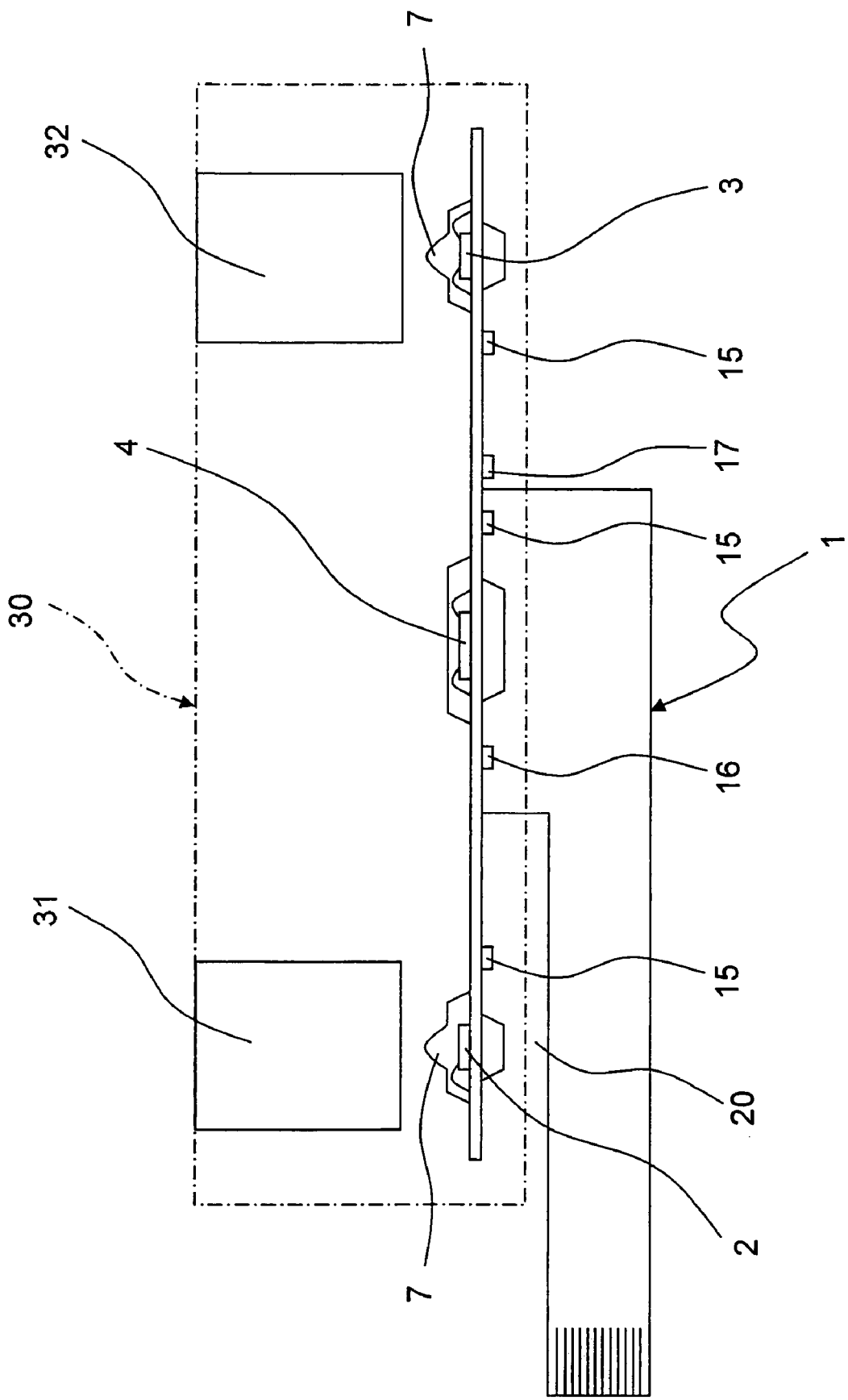
FIG. 5 is a schematic top view of an optical connector, according to a third embodiment of the present invention, that uses an optical device which is an example of the electronic device.

FIG. 5 is a schematic top view of an optical connector according to the third embodiment of the present invention. The optical connector of the third embodiment uses the optical device of the first embodiment, for which FIGS. 1 and 2 are referenced.

In the optical device of the first embodiment, as shown in FIG. 2, the light-emitting element 2, the light-receiving element 3, and the communication IC 4 are encapsulated in the independent first encapsulation members 6a, 6c and 6e, respectively, by transfer molding, so that resin leak to unintended areas is prevented. Because of this, by-pass capacitors 15 which are each an example of the capacitive element, a resistive element 16, a crystal oscillator 17, etc. required for the light-emitting element 2, light-receiving element 3, and communication IC 4 are mounted in the exposed area of the flexible board 1 by means of soldering.

In the optical connector of the third embodiment, as shown in FIG. 5, the optical device (shown in FIGS. 1 and 2) is accommodated in a housing 30 with receptacles 31 and 32 into which an optical plug provided at an end of an optical-fiber cable can be inserted. The main body 1a of the flexible board 1 of the optical device is disposed in the housing 30 while being kept planar. In this state, the flexible board 1 of the optical device is bent along the bending line 1c (shown in FIG. 1) between the main body 1a and the extended portion 1b such that the main body 1a is substantially square to the extended portion 1b. In addition, the lenses 7 of the first encapsulation members 6a and 6c for the light-emitting element 2 and the light-receiving element 3 are disposed at positions where the lenses 7 have optical coupling with the optical plugs inserted in the receptacles 31 and 32.

The optical connector using the optical device of the third embodiment is used for an optical communication device to communicate via an optical-fiber cable. The optical communication device conducts data communication between equipment using optical connectors connected via an optical-fiber cable.

Necessary circuits are formed on the flexible board 1 by mounting the by-pass capacitors 15, resister 16, and crystal oscillator 17 in the exposed areas of the flexible board 1 that are not covered with resin.

As in the optical connector described above, an optical device having a high degree of flexibility in arrangement of the light-emitting element 2 and the light-receiving element 3 can be applied to optical connectors of various specifications, and significant cost reduction can be realized by using one kind of optical devices for many kinds of optical connectors.

Furthermore, the main body 1a of the flexible board 1 of the optical device is disposed in the housing 30 while being kept planar in order that one side on which the light-emitting element 2 is mounted and the other side on which the light-receiving element 3 is mounted are in the same plane, so that the interval between the light-emitting element 2 and the light-receiving element 3 is uniquely defined, and thus positioning of the elements at fabrication is easy.

Furthermore, since the extended portion 1b of the flexible board 1 is bent so as to be substantially square to the main body 1a, it becomes easy to install the optical connector in an associated apparatus.

Fourth Embodiment

Figure 6:
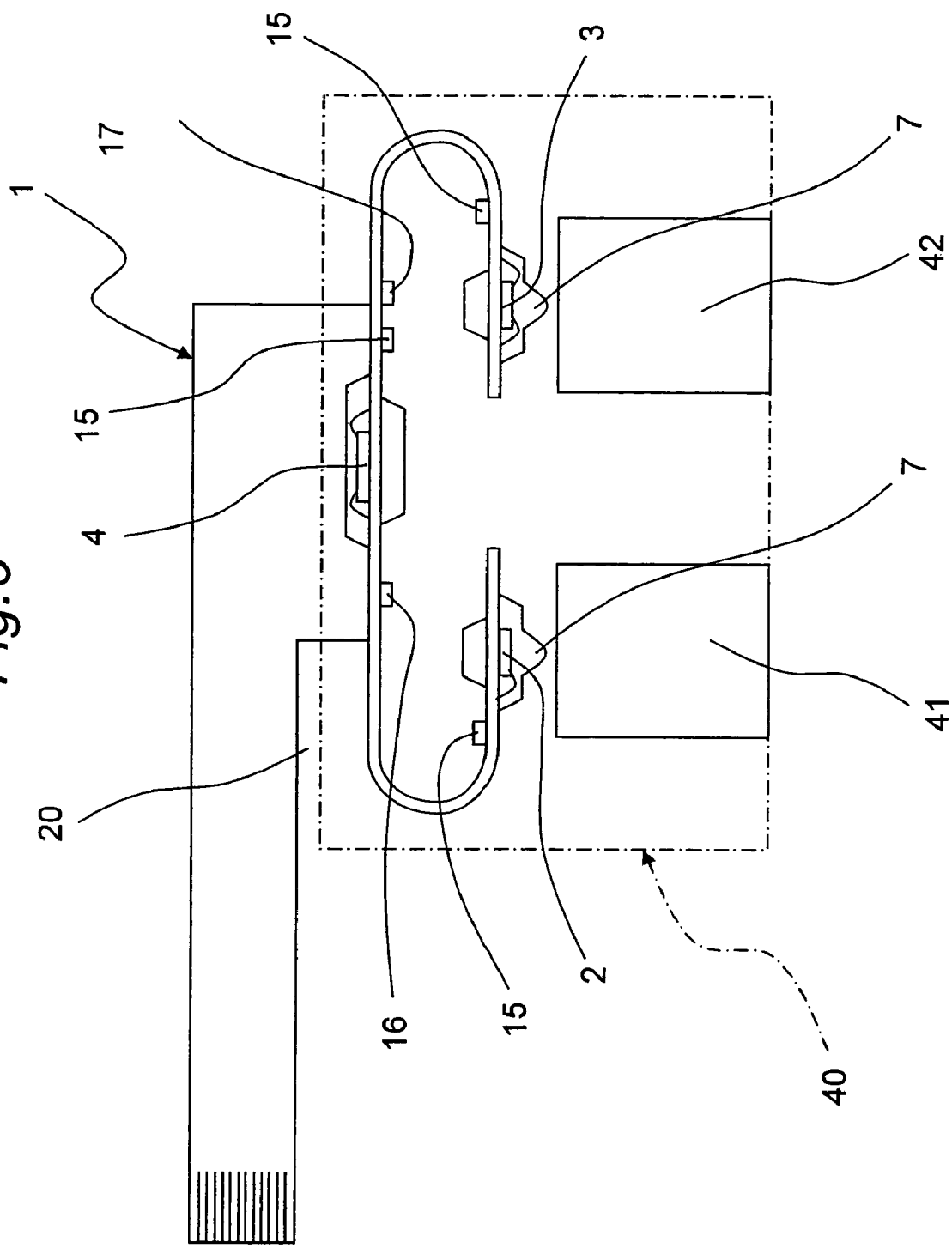
FIG. 6 is a schematic top view of an optical connector, according to a fourth embodiment of the present invention, that uses an optical device which is an example of the electronic device.

FIG. 6 is a schematic top view of an optical connector having an optical device according to the fourth embodiment of the present invention. The optical connector of the fourth embodiment utilizes the optical device of the first embodiment, for which FIGS. 1 and 2 will be referenced. The optical connector of the fourth embodiment is different from the optical connector of the third embodiment in how to bend the flexible board 1.

In the optical device of the third embodiment described above, as shown in FIG. 5, the light-emitting element 2, the light-receiving element 3, and the communication IC 4 are arranged in line in the longitudinal direction of the main body 1a of the flexible board 1. In contrast, in the optical connector shown in FIG. 6 of the fourth embodiment, both end portions of the main body 1a of the flexible board 1 are bent in a curve in such a manner that the orientation of the light-emitting element 2 and light-receiving element 3 is 180-degree different from that of the communication IC 4. That is, one end portion on which the light-emitting element 2 is mounted of the main body 1a of the flexible board 1 and the other end portion on which the light-receiving element 3 is mounted are bent toward the center side, respectively, and the bent main body 1a is disposed in a housing 40 such that the light-emitting surface of the light-emitting element 2 and the light-receiving surface of the light-receiving element 3 face the outside in one direction.

In addition, the lenses 7 of the first encapsulation members 6a and 6c for the light-emitting element 2 and the light-receiving element 3 are disposed at positions where the lenses 7 have optical coupling with optical plugs inserted in receptacles 41 and 42 of the housing.

The optical connector using the optical device of the fourth embodiment is used for an optical communication device to communicate via an optical-fiber cable.

As in the optical connector described above, the optical device having a high degree of flexibility in arrangement of the light-emitting element 2 and the light-receiving element 3 is applicable to optical connectors of various specifications, and significant cost reduction can be realized by using one kind of optical devices for many kinds of optical connectors.

Furthermore, the main body 1a of the flexible board 1 is disposed in the housing 40 in such a manner that one end side on which the light-emitting element 2 is mounted and the other end side on which the light-receiving element 3 is mounted are bent to the center side of the main body 1a, and that the light-emitting surface of the light-emitting element 2 and the light-receiving surface of the light-receiving element 3 face the outside in the same direction, so that the interval between the light-emitting element 2 and the light-receiving element 3 can be freely set according to the degree of bending of the main body 1a of the flexible board 1.

As described above, in the optical devices of the first to fourth embodiments, the light-emitting element 2 and the light-receiving element 3 are mounted on the flexible board 1, and the light-emitting element 2 and the light-receiving element 3 are encapsulated in light-permeable resin, so that the lenses can be integrally formed with the first and second encapsulation members 6a and 6b of the light-emitting element 2 and the light-receiving element 3, and resin leak to areas of the flexible board 1 other than the areas in which encapsulation members are formed can be prevented. Because of this, the flexibility of the flexible board 1 in areas other than the areas of the encapsulation members is ensured, and therefore it becomes very easy to install component parts in, for example, an optical connector product.

In addition, since resin leak to areas of the flexible board 1 other than the areas of the encapsulation members is prevented, elements such as a by-pass capacitor and the like, for example, can be soldered to the flexible board 1 in the areas having no encapsulation members after the transfer molding process.

Furthermore, optical connectors of optical communication devices using optical-fiber cables vary in shape depending on use even if they have quite identical functions, so that many kinds of optical devices should be designed and produced in accordance with specifications of such optical connectors, which is disadvantageous costwise. In contrast, in an optical connector using an optical device according to the present invention, one kind of optical devices can be used in various kinds of optical connectors having different intervals between the light-transmitting section (transmitting side receptacle 31, 41) and the light-receiving section (receiving side receptacle 32, 42), and thereby significant cost reduction can be realized.

In the first to fourth embodiments, optical devices used for optical communication as electronic devices are described. However, the present invention is not applied to these optical devices alone, and may also be applied to devices such as optical sensors provided with a light-emitting element and a light-receiving element.

Furthermore, in the first to fourth embodiments, optical devices using a double-sided flexible board are described. However, a multi-layer flexible board may be used.

Furthermore, in the optical devices of the first to fourth embodiments, the first and second encapsulation members 6a and 6b constitute the light-emitting side molded resin section, the first and second encapsulation members 6c and 6d constitute the light-receiving side molded resin section, and the first and second encapsulation members 6e and 6f constitute the integrated circuit side molded resin section. However, the light-emitting side molded resin section, the light-receiving side molded resin section, and the integrated circuit side molded resin section may be formed on only the mounting surface side of the flexible board.

Furthermore, in the first to fourth embodiments, optical devices in which the light-emitting element 2, the light-receiving element 3, and the communication IC 4 are mounted on the flexible board 1 as the electronic components are described. However, the electronic components are not limited to these, and may be passive components such as capacitive elements or resistive elements, active components such as transistors, or integrated circuits.

Moreover, in the optical devices of the first to fourth embodiments, the extended portion 1b is extended from the midsection of the main body 1a. However, the extended portion 1b may not be always extended from the midsection of the main body 1a, but may be extended from a portion of the main body 1a nearer to the element 2 or 3 than the midsection, so far as it is positioned between the light-emitting element 2 and the light-receiving element 3 and the main body 1a has flexibility between the connecting portion of the main body 1a to the extended portion and the molded resin sections 6a and 6c in which the elements 2 and 3 are encapsulated. Also in this case, the communication IC 4 and the resin package 6e are disposed in the area corresponding to the connecting portion of the main body 1*a* to the extended portion and having a width not less than those of the communication IC 4 and resin package 6*e*.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. An optical device comprising:
   a flexible board having a main body on which a light-emitting element and a light-receiving element are disposed at opposite sides, and an extended portion which extends from roughly a midsection of the main body and which has an external connection terminal at a tip thereof, the light-receiving element and the associated light-emitting element being mounted, spaced from each other, on the flexible board;
   a light-permeable light-emitting side molded resin section in which the light-emitting element is encapsulated;
   a light-permeable light-receiving side molded resin section in which the light-receiving element is encapsulated;
   a control integrated circuit mounted on the flexible board and between the light-emitting element and the light-receiving circuit; and
   an integrated circuit side molded resin section in which the control integrated circuit is encapsulated, wherein
   the light-emitting side molded resin section and the light-receiving side molded resin section are disposed apart such that the optical device is flexible between the light-emitting side molded resin section and the light-receiving side molded resin section, and
   the integrated circuit side molded resin section is disposed apart from the light-emitting side molded resin section and the light-receiving side molded resin section such that the optical device is flexible between the molded resin sections.

2. The optical device as set forth in claim 1, wherein
   the extended portion of the flexible board is bent in a direction roughly parallel to a line connecting the light-emitting element and the light-receiving element.

3. The optical device as set forth in claim 1, wherein
   a notch is provided between the main body and the extended portion of the flexible board.

4. An optical device comprising:
   a flexible board;
   a light-emitting element and a light-receiving element associated with the light-emitting element, which are mounted, spaced from each other, on the flexible board;
   a light-permeable light-emitting side molded resin section in which the light-emitting element is encapsulated; and
   a light-permeable light-receiving side molded resin section in which the light-receiving element is encapsulated, wherein
   the light-emitting side molded resin section and the light-receiving side molded resin section are disposed apart such that the optical device is flexible between the light-emitting side molded resin section and the light-receiving side molded resin section, and
   a lens is integrally formed on each of the light-emitting side molded resin section and the light-receiving side molded resin section.

5. An optical connector comprising an optical device, said optical device comprising:
   a flexible board having a main body on which a light-emitting element and a light-receiving element are disposed at opposite sides, and an extended portion which extends from roughly a midsection of the main body and which has an external connection terminal at a tip thereof, the light-receiving element and the associated light-emitting element being mounted, spaced from each other, on the flexible board;
   a light-permeable light-emitting side molded resin section in which the light-emitting element is encapsulated;
   a light-permeable light-receiving side molded resin section in which the light-receiving element is encapsulated; and
   a housing in which at least the main body of the flexible board of the optical device is accommodated, wherein
   the main body of the flexible board is disposed in the housing while being kept planar, and
   the light-emitting side molded resin section and the light-receiving side molded resin section are disposed apart such that the optical device is flexible between the light-emitting side molded resin section and the light-receiving side molded resin section.

6. An optical connector comprising an optical device, said optical device comprising:
   a flexible board having a main body on which a light-emitting element and a light-receiving element are disposed at opposite sides, and an extended portion which extends from roughly a midsection of the main body and which has an external connection terminal at a tip thereof, the light-receiving element and the associated light-emitting element being mounted, spaced from each other, on the flexible board;
   a light-permeable light-emitting side molded resin section in which the light-emitting element is encapsulated;
   a light-permeable light-receiving side molded resin section in which the light-receiving element is encapsulated; and
   a housing in which at least the main body of the flexible board of the optical device is accommodated, wherein
   the main body of the flexible board is disposed in the housing in such a manner that one side of the housing on which the light-emitting element is mounted and the other side of the housing on which the light-receiving element is mounted are turned back toward a center of the main body, and that a light-emitting surface of the light-emitting element and a light-receiving surface of the light-receiving element face outwardly in one direction, and
   the light-emitting side molded resin section and the light-receiving side molded resin section are disposed apart such that the optical device is flexible between the light-emitting side molded resin section and the light-receiving side molded resin section.

7. The optical connector as set forth in claim 5, wherein
   the extended portion of the flexible board of the optical device is bent so as to be generally square to the main body.

8. An optical device comprising:
   a flexible board;
   a light-emitting element and a light-receiving element associated with the light-emitting element, which are mounted, spaced from each other, on the flexible board;
   a light-permeable light-emitting side molded resin section in which the light-emitting element is encapsulated; and
   a light-permeable light-receiving side molded resin section in which the light-receiving element is encapsulated, wherein
   the light-emitting side molded resin section and the light-receiving side molded resin section are disposed apart such that the optical device is flexible between the light-emitting side molded resin section and the light-receiving side molded resin section, the flexible board has a flexible base, a first wiring pattern provided on one surface side of the base, and a second wiring pattern provided on another surface side opposite to the one surface side of the base, the light-emitting element and the light-receiving element are mounted on one surface of the flexible board, and are electrically connected with the first wiring pattern, the light-emitting side molded resin section and the light-receiving side molded resin section have first encapsulation members which are provided on one surface of the flexible board to encapsulate the light-emitting element and the light-receiving element, respectively, and have second encapsulation members which are provided on another surface opposite to the one surface of the flexible board to seal at least areas opposite to the light-emitting element and light-receiving element, respectively, an outer circumference of the first encapsulation member and an area near the outer circumference have no first wiring pattern on the one surface of the flexible board, and have no first wiring pattern between the one surface of the flexible board and the base, and an outer circumference of the second encapsulation member and an area near the outer circumference have no second wiring pattern on the other surface of the flexible board, and have no second wiring pattern between the other surface of the flexible board and the base.

9. The optical device as set forth in claim 8, wherein the first wiring pattern that is encapsulated in the first encapsulation member is connected with the second wiring pattern that is not encapsulated in the second encapsulation member via a through-hole.

10. The optical device as set forth in claim 8, wherein the first and second encapsulation members are each provided with a radius at their respective peripheries.

11. The optical device as set forth in claim 8, wherein reinforcements are provided between each of peripheries of the first and second encapsulation members and the flexible board.

12. The optical device as set forth in claim 8, wherein the first and second encapsulation members are connected with each other via a molding resin filled in a through-hole provided in the flexible board.

13. The optical connector as set forth in claim 6, wherein the extended portion of the flexible board of the optical device is bent so as to be generally square to the main body.

* * * * *